US006411154B1

(12) United States Patent
Mikulenka

(10) Patent No.: US 6,411,154 B1
(45) Date of Patent: Jun. 25, 2002

(54) BIAS STABILIZER CIRCUIT AND METHOD OF OPERATION

(75) Inventor: Frantisek Mikulenka, Roznov (CZ)

(73) Assignee: Semiconductor Components Industries LLC, Phoenix, AZ (US)

(*) Notice: Subject to any disclaimer, the term of this patent is extended or adjusted under 35 U.S.C. 154(b) by 0 days.

(21) Appl. No.: 09/785,750

(22) Filed: Feb. 20, 2001

(51) Int. Cl.[7] .............................................. H03K 5/08

(52) U.S. Cl. ..................... 327/530; 327/538; 327/542; 327/378; 327/256; 323/311; 323/315

(58) Field of Search ............................... 327/530, 538, 327/540, 541–3, 138, 83, 378, 512, 513, 239, 256, 257–9; 323/311–317

(56) References Cited

U.S. PATENT DOCUMENTS 4,282,477 A * 8/1981 Ahmed ...................... 323/312
4,352,056 A * 9/1982 Cave et al. ................ 323/314
4,447,784 A * 5/1984 Dobkin ...................... 323/313
4,506,208 A * 3/1985 Nagano ..................... 323/314
5,039,878 A * 8/1991 Armstrong et al. ......... 327/512

OTHER PUBLICATIONS

Deckers, Et Al., "Current Stabilization Made Easy", Components XXX (1995), No. 6, pp. 35–36.

* cited by examiner

*Primary Examiner*—Timothy P. Callahan
*Assistant Examiner*—An T. Luu

(57) ABSTRACT

A bias circuit (200, FIG. 2) includes a first bipolar junction transistor (BJT) (240), which provides, to an external transistor (204), a biasing voltage (294) equal to the first BJT's base-emitter junction voltage plus a biasing voltage at the first BJT's base (244). A current multiplying mirror circuit (250) senses a fraction of the first BJT's collector current, and produces a current equal to the collector current. This mirror current flows through a second BJT (230). A voltage at the collector (232) of the second BJT is divided, producing the biasing voltage at the base (244) of the first BJT. This biasing voltage has a temperature coefficient with an opposite sign and a same magnitude as a temperature coefficient of the first BJT's base-emitter junction voltage, resulting in a near zero temperature coefficient for the biasing voltage (294).

18 Claims, 4 Drawing Sheets

BIAS STABILIZER CIRCUIT AND METHOD OF OPERATION

BACKGROUND OF THE INVENTION

The present invention relates in general to bias circuits and, more particularly, to bias circuits that provide a constant biasing voltage regardless of the operating point of the transistor being biased.

In mobile applications, electronic equipment is required to operate in a stable manner over a fairly large temperature range (e.g., −40°F. to 100° F.). Bias circuits are used to provide stable operating points for radio frequency (RF) discrete transistors (referred to herein as "external transistors") associated with mobile and other applications.

The use of these bias circuits eliminates unacceptable fluctuations in the operating point of the external transistor. This technique allows the biased RF discrete transistor (e.g., an NPN bipolar junction transistor (BJT) or an N-channel metal oxide semiconductor (MOS) transistor) to have its emitter (or source) directly grounded and still operate with a stable collector (or drain) current.

Prior art bias circuits can provide a constant output biasing voltage with a low temperature coefficient (TC) only for a narrow range of operating points of the external transistor. If the operating point of the external transistor falls outside a narrow, design-specific range, a stable bias cannot be guaranteed. A particular design of a prior art bias circuit, therefore, cannot be applied to applications having widely differing transistor operating points.

Hence, there is a need for a bias circuit that provides a stable, accurate, and low voltage bias independent of an external transistor's specific operating point. Further needed is a bias circuit that can provide a low voltage, stable bias over a wide temperature range.

DETAILED DESCRIPTION OF THE DRAWINGS

The various embodiments provide a bias circuit that provides a stable, accurate, and low voltage bias over a wide temperature range independent of an external transistor's specific operating point. The temperature coefficient (TC) of the bias circuit's output biasing voltage is based on the sum of the positive and negative TCs of the bias circuit's internal components. In one embodiment, the TC of the bias circuit's output voltage is very low, and is insensitive to the operating point of the external biased transistor. This is accomplished, in accordance with various embodiments, by an internal feedback loop, which senses the operating point of the external transistor and causes all TCs of the bias circuit's internal components always to be properly matched and compensated. Under such conditions, the output biasing voltage will exhibit a low TC for a broad range of applications.

Prior art bias circuits have temperature compensation of the output biasing voltage, but these circuits do not include a feedback loop for sensing the operating point of the external transistor. As a result, prior art biasing circuits are able to provide a stable bias only within a narrow range of operating points of the external transistor.

Figure 1:
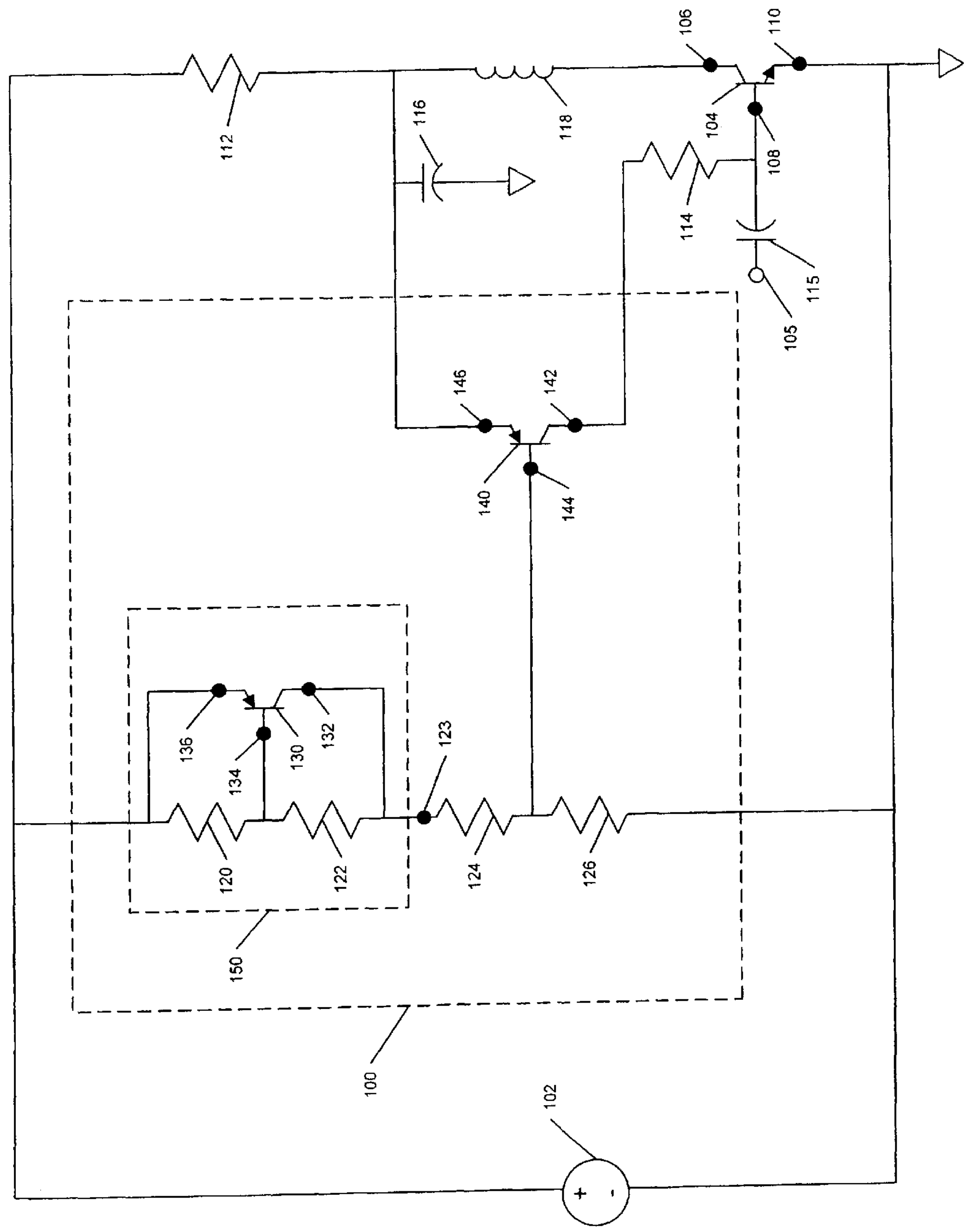
FIG. 1 PRIOR ART
FIG. 1 illustrates a bias circuit in accordance with the prior art.

FIG. 1 illustrates an example of a typical RF amplifier stage with a biasing circuit 100 in accordance with the prior art. External power supply 102 supplies power to bias circuit 100, and bias circuit 100 provides a biasing voltage to the collector of an external transistor 104. Bias circuit 100 also provides a current output to drive the base of external transistor 104.

External transistor 104 can be, for example, a BJT that is used as an amplifier stage for an input AC signal 105. Accordingly, external transistor 104 has a collector 106, a base 108, and an emitter 110. Other components, such as resistor 114, capacitors 115, 116, and inductor 118 are linked to the AC behavior of the amplifier stage. Resistor 112 is selected to set up a desired DC current through external transistor 104.

Bias circuit 100 includes resistors 120, 122, 124, 126, and PNP BJTs 130, 140. BJTs 130, 140 each include a collector 132, 142 a base 134, 144 and an emitter 136, 146, respectively.

The purpose of bias circuit 100 is to provide a constant, low TC biasing voltage on the collector 106 of external transistor 104 and, at the same time, to provide a bias current on the base 108 of external transistor 104. One difficulty in keeping the voltage at collector 106 constant is that the base-emitter junction voltage of biasing BJT 140 is temperature dependent.

As the temperature of the base-emitter junction rises, the voltage drop on the base-emitter junction decreases by roughly 2 millivolts (mV) per degree Celsius. The exact value of this negative TC is dependant on the value of the current (i.e., the current density) flowing through the base-emitter junction of BJT 140

The resulting DC voltage at collector 106 is the sum of the voltage at the base 144 of biasing BJT 140 and the voltage drop of the base-emitter junction of biasing BJT 140.

Therefore, in order to keep the voltage at collector 106 constant, the negative TC of the base-emitter junction voltage of biasing BJT 140 must be compensated for with a voltage having positive TC at the base 144 of biasing BJT 140, with a net result of a near zero temperature coefficient at collector 106.

Such a positive TC voltage is achieved, in the prior art system, using a base-emitter junction voltage multiplier 150, referred to herein as a "Vbe multiplier." Vbe multiplier 150 includes PNP BJT 130 and resistors 120, 122. Resistors 120, 122 and BJT 130 essentially multiply the base-emitter junction voltage of BJT 130.

The voltage drop across Vbe multiplier 150, as well as the final TC of the voltage at point 123 is determined by the ratio of resistors 122 and 120. Because Vbe multiplier 150 is connected to power supply 102, the voltage on the collector 132 of BJT 130 exhibits a positive TC. For proper temperature compensation of the bias circuit 100 as a whole, the ratio of resistors 122 and 120 is set up to be greater than one. The Vbe value and the TC of BJT 130 is multiplied by this ratio. The positive TC of the voltage at collector 132 compensates for the negative TC of the base-emitter junction voltage of BJT 140.

Resistors 124, 126 are selected to set the voltage at the base 144 of biasing BJT 140 to have a TC that exactly compensates for the base-emitter junction voltage TC of BJT 140. This results in a voltage having a near zero TC at the collector 106 of external transistor 104.

The collector current through biasing BJT 140 will be different for different applications, and the base-emitter junction voltage and the TC of transistor 140 will vary accordingly, while the current through BJT 130 will remain fixed. This results in a limitation of the prior art system, which is that resistors 124, 126 can be selected to provide a near zero TC voltage at collector 106 for only a narrow operating range of external transistor 104. Using the prior art system, therefore, it is not possible to achieve good matching over a broad range of operating points of external transistor 104. If the operating point of transistor 104 falls outside a design-specific range, a stable bias cannot be guaranteed. A particular design of bias circuit 100, therefore, cannot be applied to applications having different transistor operating points.

This limitation of the prior art is overcome, in one embodiment, by sensing the current of the biasing BJT, and using the sensed current to match the TCs of the bias circuit's internal components, resulting in a constant output biasing voltage at the collector of the external transistor.

Figure 2:
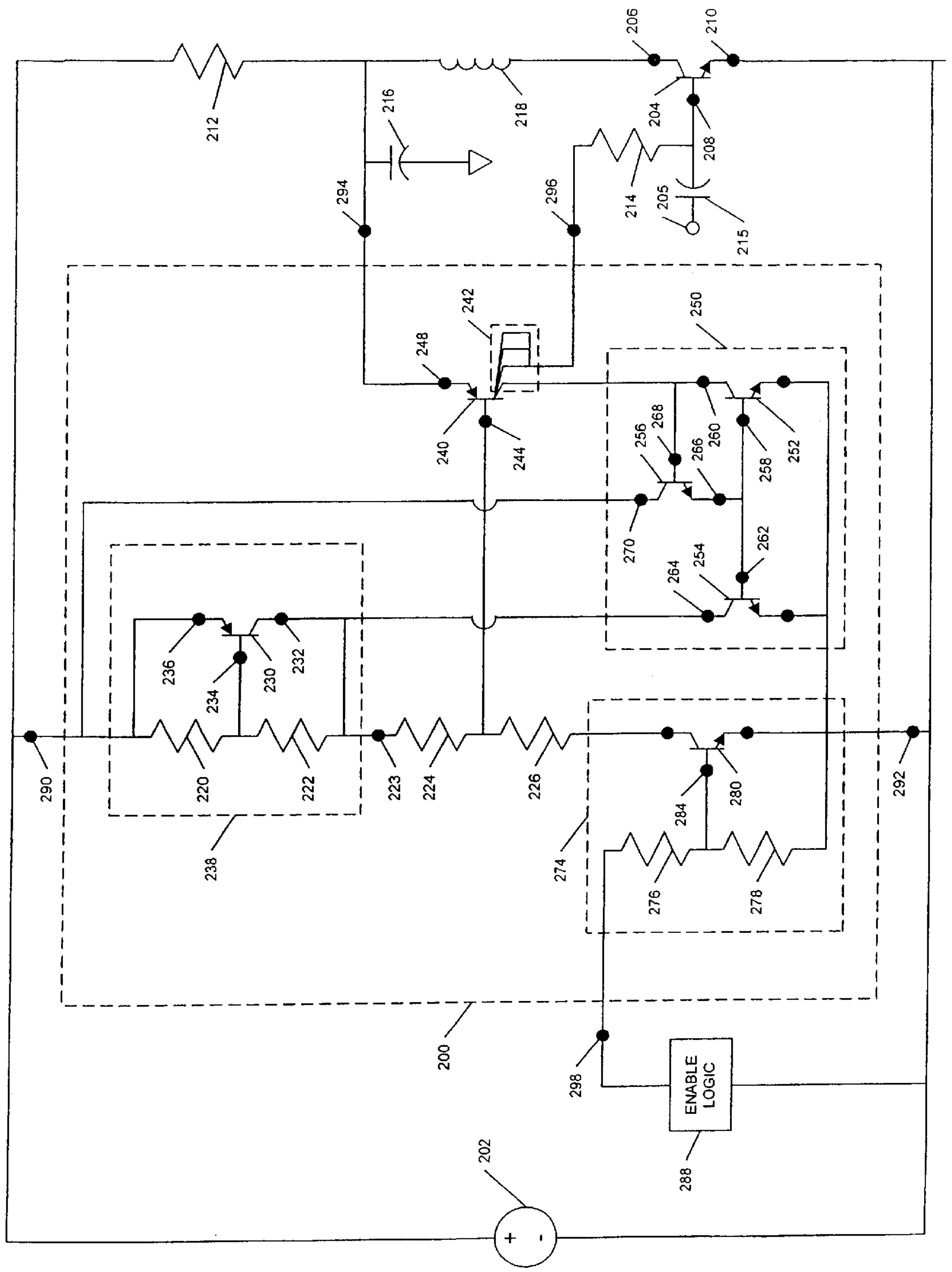
FIG. 2 illustrates a bias circuit in accordance with one embodiment.

FIG. 2 illustrates a bias circuit in accordance with one embodiment. In one embodiment, bias circuit 200 forms part of a mobile communication unit, such as a mobile telephone, pager, personal communication system, radio, or other device. However, bias circuit 200 could form part of virtually any other system that requires a stable bias, in other embodiments.

External power supply 202 supplies power to bias circuit 200. In one embodiment, power supply 202 is a typical mobile telephone battery, supplying a DC voltage of approximately 2.75 V. Power supply 202 could be other types of power supplies and could supply higher or lower DC voltages, in other embodiments.

Bias circuit 200 provides a stable biasing voltage to an external transistor 204. External transistor 204 can be, for example, a BJT that is used for amplifying a signal 205 within an RF stage of a mobile communication unit. Accordingly, external transistor 204 has a collector 206, base 208, and emitter 210. Other components, such as resistor 214, capacitors 215, 216, and inductor 218 are linked to the AC behavior of the amplifier stage.

With a stable biasing voltage provided by bias circuit 200 at collector 206, resistor 212 is selected to set up a desired DC current through external transistor 204.

Bias circuit 200 includes biasing BJT 240, current multiplying mirror circuit 250, Vbe multiplier circuit 238, and a voltage (TC) divider circuit that includes resistors 224 and 226. In one embodiment, bias circuit 200 also includes enable circuit 274.

After a brief description of the operation of bias circuit 200 in this and the next few paragraphs, each circuit and component will be discussed in detail. Basically, bias circuit 200 is enabled by enable circuit 274. When enabled, biasing BJT 240 provides a stable biasing voltage, at point 294, to the collector 206 of external transistor 204. In addition, biasing BJT 240 provides a bias current, at point 296, to the base 208 of external transistor 204.

The biasing voltage at point 294 is the sum of the voltage at the base 244 of biasing BJT 240 and the base-emitter junction voltage of biasing BJT 240. Therefore, in order to keep the voltage at point 294 constant, the negative TC of the base-emitter junction voltage of biasing BJT 240 is compensated for with a voltage having positive TC at the base 244 of biasing BJT 240, with a net result of a near zero TC at point 294.

To achieve this near zero TC voltage at point 294, independent of the collector current of BJT 240, a fraction of the collector current of biasing BJT 240 is sensed. Sensing is made possible by using a multiple collector BJT for BJT 240.

The sensed fraction of collector current is then multiplied by current multiplying mirror circuit 250 to produce a duplicated version of the collector current of BJT 240. The resulting mirrored current is used for biasing Vbe multiplier 238, which generates a positive TC voltage at collector 232 to compensate for the negative TC of the base-emitter junction voltage of BJT 240.

Resistors 224, 226 set the voltage at the base 244 of biasing BJT 240 to have a TC that exactly compensates for the base-emitter junction voltage TC of BJT 240. This results in a voltage having a near zero TC at the collector 206 of external transistor 204.

Transistors 230 and 240 are the same type of transistor. Because current multiplying mirror circuit 250 causes BJT 230 to draw the same current as BJT 240, both BJTs 230, 240 have approximately identical TC values, regardless of the collector current through the biasing BJT. By using the current multiplying mirror circuit 250 in a feedback loop, the TC of the base-emitter junction voltage of BJT 230 tracks the TC of the base-emitter junction voltage of BJT 240.

Enable circuit 274 is used to activate and deactivate bias circuit 200 based on an input signal from enable logic 288. Enable circuit 274 includes transistor 280, and resistors 276 and 278, in one embodiment. To activate bias circuit 200, enable logic 288 produces a positive voltage (e.g., 2.75 V) at point 298. Resistors 276, 278 form a voltage divider, which produces a proper biasing voltage (e.g., 0.7 V) at the base 284 of transistor 280. Once biased, current flows through transistor 280, effectively connecting resistor 226 to ground.

Transistor 280 basically works as an on/off switch for bias circuit 100. When enable logic 288 produces no voltage, transistor 280 is off, and resistor 226 is disconnected from ground, thus deactivating bias circuit 200. In an alternate embodiment, bias circuit 200 is always enabled by directly connecting resistor 226 to ground, and eliminating enable circuit 274.

When bias circuit 200 is activated, the base 244 of biasing BJT 240 is biased by a voltage produced between resistors 224 and 226. Biasing BJT 240, in turn, biases external transistor 204 by producing a biasing voltage at point 294 and a bias base current at point 296.

In one embodiment, biasing BJT 240 is a PNP BJT, which includes a collector 242, base 244, and emitter 248. Collector 242 has multiple, separately accessible collector regions. For example, collector 242 could have four collector regions, as illustrated in FIG. 2. In alternate embodiments, collector 242 could have more collector regions.

In one embodiment, the current through each collector region is equal in magnitude, because the perimeter of each collector region is the same. Thus, the current through each collector region equals a fraction of the entire collector current, where the fraction equals the inverse of the number of collector regions through which current flows. For example, where four collector regions are present, the current through any one collector region equals ¼ of the entire collector current. If collector 242 included eight regions, the current through any one collector region would equal ⅛ of the entire collector current. In alternate embodiments, the current through each collector region is not equal.

In accordance with one embodiment , a fraction (i.e., at least one) of the multiple collector regions is electrically connected to current mirror circuit 250. At least one of the remainder of the multiple collector regions is connectable to the base 208 of external transistor 204, or to any intermediate circuitry (e.g., resistor 214).

Current mirror circuit 250 receives, as an input, a fraction of the collector current through the collector 242 of biasing BJT 240. Current mirror circuit 250 multiplies the input current to produce an output current that is approximately equal to the entire collector current through collector 242. This current sensing and multiplication can be done in many ways. In an embodiment described below, current multiplication is achieved by using BJTs with different emitter areas, where the ratio of emitter areas equals the multiplication factor. The embodiment described below should not be taken to be limiting in any sense, as current multiplication could be performed in other ways, as well.

Current mirror circuit 250 includes transistors 252, 254, and 256, in one embodiment. In one embodiment, transistors 252, 254, and 256 are NPN BJTs, although the functionality of circuit 250 could be achieved using other types of current mirrors, in other embodiments.

Transistor 256 is used to bias transistors 252 and 254, and to eliminate current multiplication errors that might otherwise be caused by the base currents of transistors 252, 254. The collector 270 of transistor 256 is connected to power supply 202, the base 268 is connected to one or more collector regions of collector 242, and the emitter 266 is connected to the bases 258, 262 of transistors 252 and 254, respectively.

The collector 260 of transistor 252 is connected to one or more collector regions of collector 242. In one embodiment, they are the same regions that are connected to base 268, although they could be different regions in other embodiments. When biased by transistor 256, most of the collector current through the one or more collector regions that are connected to transistor 252 flows through transistor 252 to ground.

Current also flows through transistor 254. The ratio of the currents flowing through transistors 252 and 254 is determined by the ratio of the emitter areas of these transistors. In one embodiment, the emitter area of transistor 254 has a size that is a multiple of the size of the emitter area of transistor 252. This multiple is the inverse of the fraction of the biasing BJT's collector regions that are coupled to mirror circuit 250. For example, as shown in FIG. 2, ¼ of the collector regions of collector 242 are coupled to circuit 250. Accordingly, the emitter area of transistor 254 is four times the size of the emitter area of transistor 252. Accordingly, when biased by transistor 256, the amount of collector current flowing through transistor 254 equals four times the collector current flowing through transistor 252, which also approximately equals the entire collector current flowing through collector 242 of biasing BJT 244.

The collector current through transistor 254 drives voltage multiplier circuit 238. In one embodiment, voltage multiplier circuit 238 includes BJT 230 and resistors 220, 222. BJT 230 is the same type of transistor, with the same emitter area, as BJT 240, in one embodiment.

Resistors 220, 222 and BJT 230 essentially multiply the base-emitter junction voltage of BJT 230. The voltage drop across Vbe multiplier 238, as well as the final TC of the voltage at point 223 is determined by the ratio of resistors 222 and 220.

Because Vbe multiplier 238 is connected to power supply 202, the voltage on the collector 232 of BJT 230 exhibits a positive TC. For proper temperature compensation of the bias circuit 200 as a whole, the ratio of resistors 222 and 220 is set up to be greater than one. The Vbe value and the TC of BJT 230 are multiplied by this ratio. The positive TC of the voltage at collector 232 compensates for the negative TC of the base-emitter junction voltage of BJT 240.

Resistors 224, 226 form a voltage divider, and they are selected to set the voltage at the base 244 of biasing BJT 240 to have a TC that exactly compensates for the base-emitter junction voltage TC of BJT 240. This results in a biasing voltage having a near zero TC at the collector 206 of external transistor 204.

Unlike the prior art bias circuit (e.g., circuit 100, FIG. 1), the current through BJT 230 is not fixed. Instead, the current through BJT 230 is approximately the same as the current through biasing BJT 240. Accordingly, by sensing and mirroring the collector current through biasing BJT 240, the TC of the base-emitter junction voltage of biasing BJT 240 can be accurately compensated for by voltage multiplier circuit 238, regardless of the magnitude of the collector current through biasing BJT 240. In other words, because transistors 230, 240 are of the same type, and the same current is drawn through both transistors 230, 240, the TC tracking and matching of transistors 240 and 230 is guaranteed under all conditions.

Using the various embodiments, therefore, it is possible to achieve good matching over a broad range of operating points of external transistor 204. A particular design of bias circuit 200, therefore, can be applied to applications having different transistor operating points.

In one embodiment, BJT 240, mirror circuit 250, voltage multiplier circuit 238, resistors 224, 226, and enable circuit 274 are a part of an integrated circuit device. This device includes pins for power 290, ground 292, biasing voltage 294, bias current 296, and enable 298, in one embodiment. In alternate embodiments, some or all of the components of bias circuit 200 could be implemented using discrete devices.

Various alterations and substitutions could be made to bias circuit 200, in alternate embodiments. For example, current mirror circuit 250 could be implemented differently, in an alternate embodiment. Enable circuit 274 also could be implemented differently, or could be eliminated altogether, in other embodiments.

Figure 3:
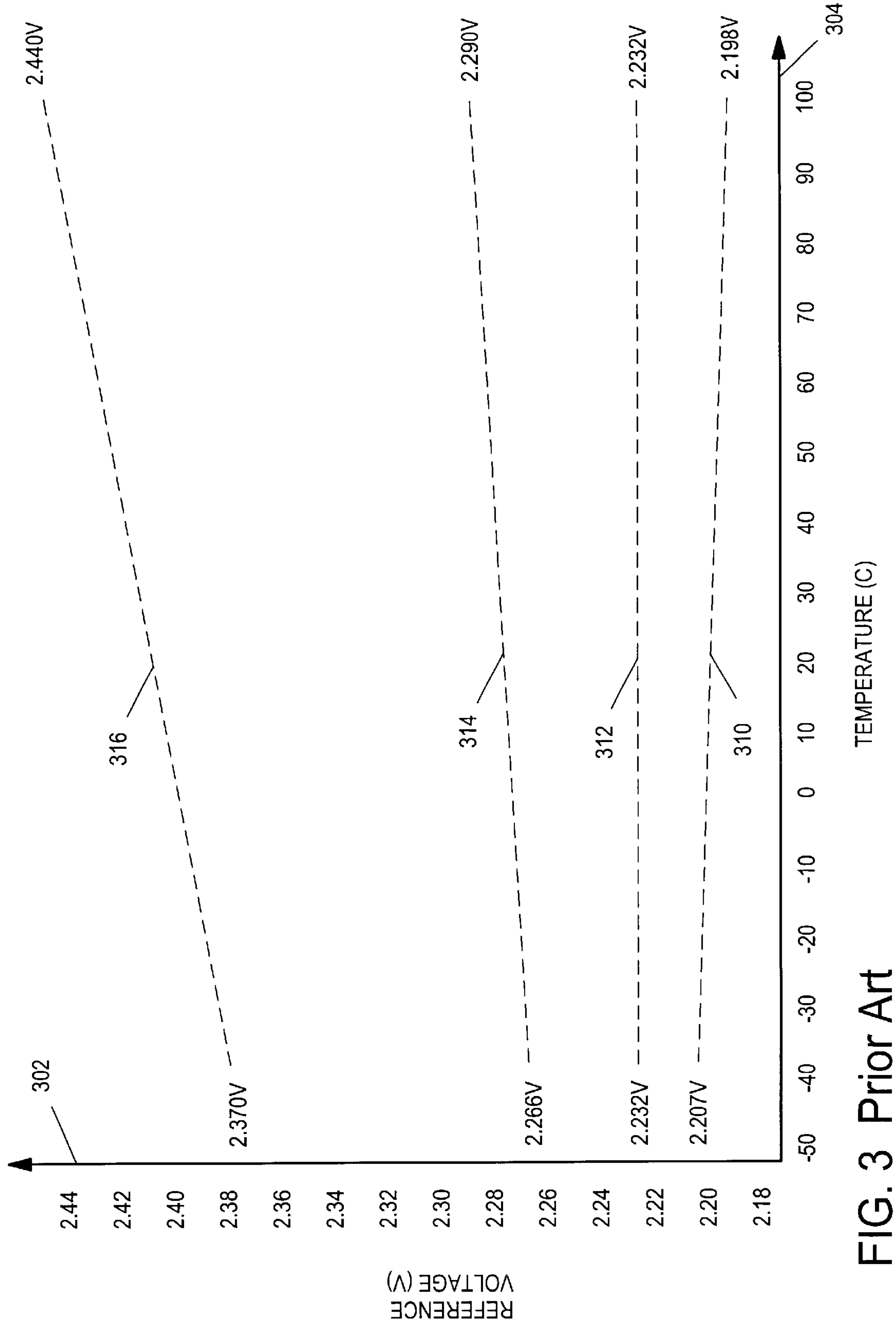
FIG. 3 Prior Art
FIG. 3 illustrates the performance of the bias circuit shown in FIG. 1 at various operating points over a 140° C. temperature range.

FIG. 3 illustrates the performance of the bias circuit shown in FIG. 1 at various operating points over a 140° C. temperature range. Referring also to FIG. 1, the vertical axis 302, labeled "Reference Voltage," indicates the biasing voltage present at the emitter 146 of BJT 140. This voltage also represents the voltage provided by bias circuit 100 to the collector 106 of external transistor 104. The horizontal axis 304, labeled "Temperature," indicates the ambient temperature.

Each graph line 310, 312, 314, 316 indicates the biasing voltage, over temperature, for a different collector current through BJT 140 (i.e., the base current of external transistor 104). Line 310 corresponds to a current of 10 microAmps ($\mu$A), line 312 corresponds to a current of 30 $\mu$A, line 314 corresponds to a current of 100 $\mu$A, and line 316 corresponds to a current of 500 $\mu$A.

As FIG. 3 indicates, bias circuit 100 is designed to provide a perfectly stable bias over temperature for a 30 $\mu$A collector current (line 312). At 10 $\mu$A (line 310), the biasing voltage drops by approximately 0.009 V (i.e., 0.4%) over temperature. At 100 $\mu$A (line 314), the biasing voltage increases by approximately 0.024 V (i.e., 1.0%) over temperature. At 500

μA (line 316), the biasing voltage increases by approximately 0.07 V (i.e., 3.0%) over temperature.

In many applications, a 3.0% difference in biasing voltage will result in unacceptable system performance. Therefore, a bias circuit having a more stable bias over temperature at various operating points is desirable.

Figure 4:
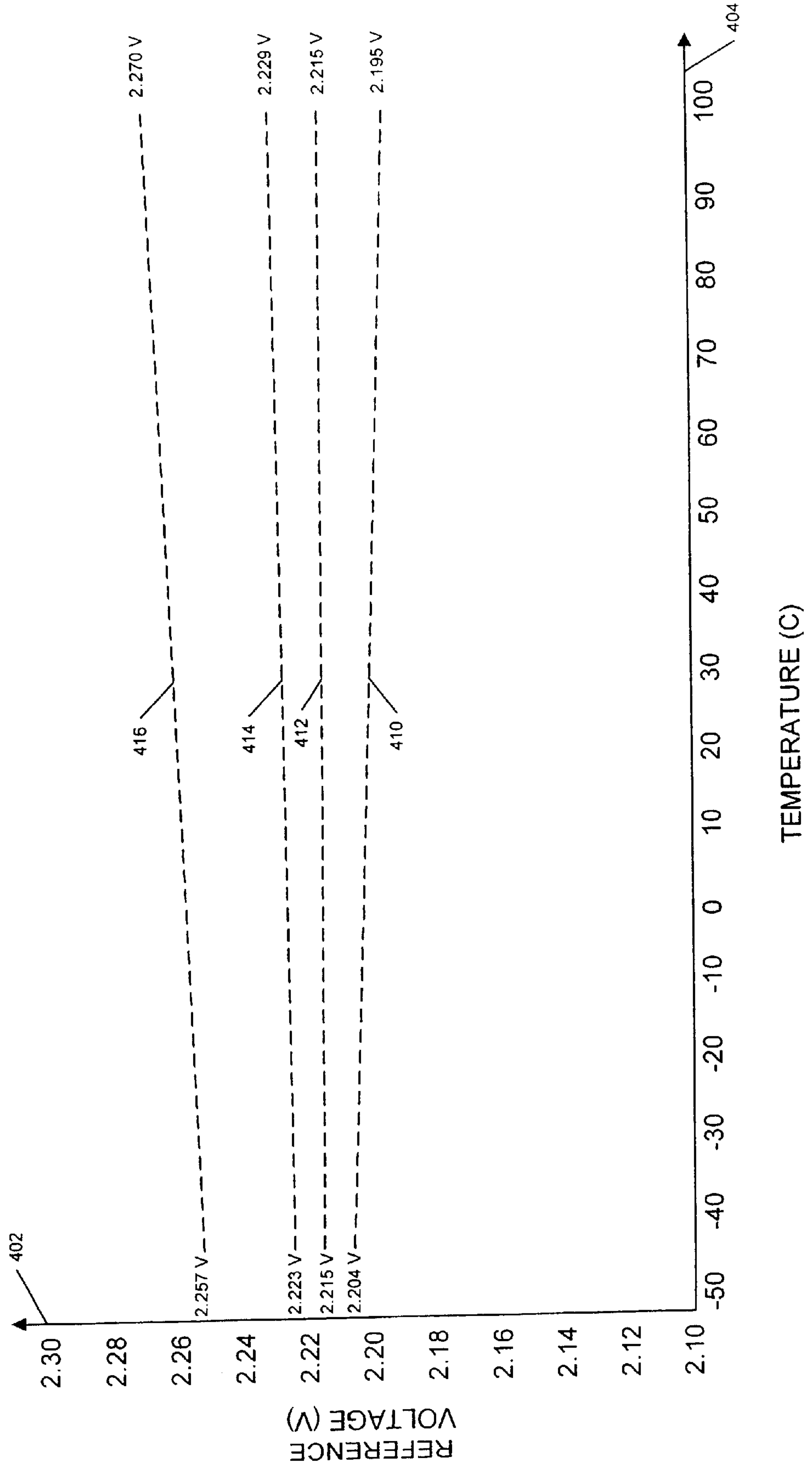
FIG. 4 illustrates the performance of the bias circuit shown in FIG. 2 at various operating points and over the same temperature range as illustrated in FIG. 3.

FIG. 4 illustrates the performance of the bias circuit shown in FIG. 2 at various operating points and over the same temperature range as illustrated in FIG. 3. Referring also to FIG. 2, the vertical axis 402, labeled "Reference Voltage," indicates the biasing voltage present at the emitter 248 of BJT 240. This voltage also represents the voltage provided by bias circuit 200 to the collector 206 of external transistor 204. The horizontal axis 404, labeled "Temperature," indicates the ambient temperature. Line 410 corresponds to a collector current through BJT 240 of 10 microAmps (μA), line 412 corresponds to a current of 30 μA, line 414 corresponds to a current of 100 μA, and line 416 corresponds to a current of 500 μA.

Bias circuit 200 is designed to provide a perfectly stable bias over temperature for a 30 μA collector current (line 412). At 10 μA (line 410), the biasing voltage drops by approximately 0.009 V (i.e., 0.4%) over temperature. At 100 μA (line 414), the biasing voltage increases by approximately 0.006 V (i.e., 0.3%) over temperature. At 500 μA (line 416), the biasing voltage increases by approximately 0.01 V (i.e., 0.6%) over temperature.

In comparing the performance of bias circuits 100, 200, it is apparent from the above results that bias circuit 200 provides a substantially more stable bias at higher collector currents. Specifically, at a 500 μA collector current, bias circuit 200 has a biasing voltage variation over temperature that is 80% smaller than the variation experienced by prior art bias circuit 100.

In summary, the various embodiments provide a bias circuit that provides a stable, accurate, and low voltage bias over a wide temperature range independent of an external transistor's specific operating point. In one embodiment, an internal feedback loop senses the operating point of the external transistor and causes all TCs of the bias circuit's internal components always to be properly matched and compensated.

In the foregoing detailed description, reference is made to the accompanying drawings, which form a part hereof, and in which are shown by way of illustration specific embodiments. These embodiments are described in sufficient detail to enable those skilled in the art to practice the them. The foregoing detailed description uses terms that are provided in order to make the detailed description more easily understandable. It is to be understood that these terms and the phraseology employed in the description should not be construed to limit the scope of the invention.

It will be further understood that the diagrams illustrated in the figures are merely representational and are not drawn to scale. Certain proportions thereof may be exaggerated, while others may be minimized. The figures are intended to illustrate various embodiments, which can be understood and appropriately carried out by those of ordinary skill in the art.

It will be appreciated by those of ordinary skill in the art that any arrangement, which is calculated to achieve the same purpose, may be substituted for the specific embodiment shown. In addition, although the various embodiments are described in conjunction with a mobile application, the various embodiments could be used for any type of application where a stable bias of a transistor is desired.

This application is intended to cover any adaptations or variations of the present invention that fall within its scope. The foregoing detailed description, therefore, is not to be taken in a limiting sense, and it will be readily understood by those skilled in the art that various changes in the details, materials, and arrangements of the parts and operations which have been described and illustrated in order to explain the nature of this invention may be made without departing from the scope of the invention as expressed in the adjoining claims.

What is claimed is:

1. A bias circuit for biasing an external transistor, the bias circuit comprising:

a first bipolar junction transistor (BJT) having a first base-emitter junction voltage with a first temperature coefficient, and a first collector through which a first collector current flows;

a second BJT having a second base emitter junction voltage with a second temperature coefficient that is approximately equal to the first temperature coefficient, and a second collector through which a second collector current flows, wherein the second collector current is a duplicated version of the first collector current; and a voltage divider circuit, coupled to divide a voltage at the second collector to provide a biasing voltage to a first base of the first BJT that has a third temperature coefficient with an opposite sign and a same magnitude as the first temperature coefficient.

2. The bias circuit as claimed in claim 1, further comprising:

a first circuit, coupled to the first collector of the first BJT, which senses a fraction of the first collector current and produces the duplicated version of the first collector current.

3. The bias circuit as claimed in claim 2, wherein the first collector includes multiple collector regions, wherein a fraction of the multiple collector regions is coupled to the first circuit, and at least one of a remainder of the multiple collector regions is connectable to a base of the external transistor.

4. The bias circuit as claimed in claim 3, wherein the first circuit comprises:

a third BJT having a third collector that is coupled to the second collector of the second BJT; and a fourth BJT having a fourth collector that is coupled to the fraction of the multiple collector regions, and wherein the third BJT has an emitter area with a size that is a multiple of a size of an emitter area of the fourth BJT, and wherein the multiple equals an inverse of the fraction of the multiple collector regions that are coupled to the fourth BJT.

5. The bias circuit as claimed in claim 4, wherein the first circuit further comprises a fifth BJT having a fifth base that is coupled to the fraction of the multiple collector regions, and an emitter that is coupled to a third base of the third BJT and a fourth base of the fourth BJT.

6. The bias circuit as claimed in claim 1, further comprising a pair of resistors, coupled to the second BJT, that provide a biasing voltage at a second base of the second BJT.

7. The bias circuit as claimed in claim 1, further comprising:

a voltage divider circuit, coupled to the second collector, which divides a voltage at the second collector to provide a biasing voltage to a first base of the first BJT, wherein the biasing voltage has a third temperature coefficient with an opposite sign and a same magnitude as the first temperature coefficient; and an enable circuit, coupled to the voltage divider circuit, wherein an input signal to the enable circuit activates and deactivates the bias circuit.

8. The bias circuit as claimed in claim 1, wherein the first BJT and the second BJT are a part of an integrated circuit device.

9. A mobile communication unit comprising:

a first transistor for amplifying a signal, the first transistor including a first collector and a first base; and a bias circuit including:

a second transistor that provides a biasing voltage to the first collector and a bias current to the first base, the second transistor having a second collector through which a second collector current flows, and a first base-emitter junction voltage with a first temperature coefficient, a third transistor having a second base emitter junction voltage with a second temperature coefficient that is approximately equal to the first temperature coefficient, and a third collector through which a third collector current flows, wherein the third collector current is a duplicated version of the second collector current, and a voltage divider circuit, coupled to divide a voltage at the third collector to provide a biasing voltage to a second base of the second transistor, wherein the biasing voltage has a third temperature coefficient with an opposite sign and a same magnitude as the first temperature coefficient.

10. The mobile communication unit as claimed in claim 9, further comprising:

a first circuit, coupled to the second collector, which senses a fraction of the second collector current and produces the duplicated version of the second collector current, and wherein the second collector includes multiple collector regions, and a fraction of the multiple collector regions is coupled to the first circuit, and at least one of a remainder of the multiple collector regions is connectable to the first base of the first transistor.

11. The mobile communication unit as claimed in claim 10, wherein the first circuit comprises:

a fourth transistor having a fourth collector, a fourth base, and a fourth emitter, wherein the fourth collector is coupled to the third collector; and a fifth transistor having a fifth collector that is coupled to the fraction of the multiple collector regions, a fifth emitter, and a fifth base, and wherein the fourth transistor has an emitter area with a size that is a multiple of a size of an emitter area of the fifth transistor, and the multiple equals an inverse of the fraction of the multiple collector regions that is coupled to the fifth transistor.

12. The mobile communication unit as claimed in claim 11, wherein the first circuit further comprises a sixth transistor having a sixth base that is coupled to the fraction of the multiple collector regions, and a sixth emitter that is coupled to the fourth base of the fourth transistor and the fifth base of the fifth transistor.

13. The mobile communication unit as claimed in claim 9, wherein the voltage divider circuit includes a pair of resistors, coupled to the third transistor, that provide the biasing voltage.

14. The mobile communication unit as claimed in claim 9, further comprising:

an enable circuit, coupled to the voltage divider circuit, wherein an input signal to the enable circuit activates and deactivates the bias circuit.

15. A method for biasing an external transistor performed by a bias circuit, the method comprising:

sensing, by a first circuit, a fraction of a first current through a first collector of a first bipolar junction transistor (BJT), wherein the first BJT has a base-emitter junction voltage with a first temperature coefficient;

producing, by the first circuit, a second current that is approximately equal to the first current, wherein the second current flows through a second collector of a second BJT; and dividing a second voltage at the second collector to provide a biasing voltage to the first BJT, wherein the biasing voltage has a second temperature coefficient with a same magnitude but an opposite sign from the first temperature coefficient.

16. The method as claimed in claim 15, wherein the first collector of the first BJT includes multiple collector regions, a fraction of the multiple collector regions is coupled to the first circuit, and at least one of a remainder of the multiple collector regions is connectable to a base of the external transistor, and wherein producing the second current comprises biasing a third BJT, which has an emitter area with a size that is a multiple of a size of an emitter area of a fourth BJT, and the multiple equals an inverse of the fraction of the multiple collector regions that are coupled to a fourth collector of the fourth BJT.

17. The method as claimed in claim 15, wherein the first BJT and the second BJT are of a same type, and producing the second current comprises biasing the second BJT so that the second current flows through the second collector, and the second voltage is established at the second collector.

18. The method as claimed in claim 15, further comprising activating and deactivating the bias circuit based on an input signal.

* * * * *